US011101336B2

(12) United States Patent
Jeong et al.

(10) Patent No.: US 11,101,336 B2
(45) Date of Patent: Aug. 24, 2021

(54) DISPLAY DEVICE AND MANUFACTURING METHOD THEREOF

(71) Applicant: SAMSUNG DISPLAY CO., LTD., Yongin-si (KR)

(72) Inventors: Yu-Gwang Jeong, Yongin-si (KR); Su Bin Bae, Yongin-si (KR); Joon Geol Lee, Yongin-si (KR); Sang Gab Kim, Yongin-si (KR); Shin Il Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 37 days.

(21) Appl. No.: 16/260,293

(22) Filed: Jan. 29, 2019

(65) Prior Publication Data

US 2019/0280067 A1     Sep. 12, 2019

(30) Foreign Application Priority Data

Mar. 8, 2018 (KR) .................. 10-2018-0027352

(51) Int. Cl.
*H01L 29/08* (2006.01)
*H01L 27/32* (2006.01)
(Continued)

(52) U.S. Cl.
CPC ...... *H01L 27/3248* (2013.01); *H01L 27/1248* (2013.01); *H01L 29/41733* (2013.01);
(Continued)

(58) Field of Classification Search
CPC .......... H01L 27/3248; H01L 29/78675; H01L 29/458; H01L 29/41733; H01L 27/1248;
(Continued)

(56) References Cited

U.S. PATENT DOCUMENTS 6,608,353 B2 * 8/2003 Miyazaki .......... H01L 23/53223
257/350
6,958,490 B2 * 10/2005 Okamoto ................ H01L 27/12
257/40

(Continued)

FOREIGN PATENT DOCUMENTS

KR   10-2003-0082385 A   10/2003
KR       10-1686095 B1   12/2016
(Continued)

OTHER PUBLICATIONS

The extended European search report for European Patent Application No. 19161402.3 dated Jul. 18, 2019.

*Primary Examiner* — Caleb E Henry
(74) *Attorney, Agent, or Firm* — Kile Park Reed & Houtteman PLLC

(57) ABSTRACT

A display device and a method for manufacturing a display device, the device including a semiconductor layer on a substrate; a gate insulation layer and an interlayer insulation layer that overlap the semiconductor layer; contact holes that penetrate the gate insulation layer and the interlayer insulation layer; a source electrode and a drain electrode that are electrically connected with the semiconductor layer through the contact holes; a light emitting diode that is connected with the drain electrode; and first spacers and second spacers between the source electrode and the interlayer insulation layer and between the drain electrode and the interlayer insulation layer in the contact holes.

18 Claims, 8 Drawing Sheets

(51) Int. Cl.
*H01L 29/786* (2006.01)
*H01L 29/45* (2006.01)
*H01L 29/417* (2006.01)
*H01L 27/12* (2006.01)

(52) U.S. Cl.
CPC ............ H01L 29/45 (2013.01); H01L 29/458 (2013.01); H01L 29/7869 (2013.01); H01L 29/78675 (2013.01); *H01L 27/3244* (2013.01); *H01L 2227/323* (2013.01)

(58) Field of Classification Search
CPC . H01L 29/7869; H01L 29/45; H01L 27/3244; H01L 2227/323; H01L 27/3276; H01L 29/08
See application file for complete search history.

(56) References Cited

U.S. PATENT DOCUMENTS

| | | | | |
|---|---|---|---|---|
| 7,482,182 B2* | 1/2009 | Yamazaki | ........... | H01L 51/0096 438/22 |
| 7,554,128 B2* | 6/2009 | Okamoto | ................ | H01L 27/12 257/40 |
| 7,579,771 B2* | 8/2009 | Yamazaki | ........... | H01L 27/3246 313/504 |
| 7,663,305 B2* | 2/2010 | Yamazaki | ........... | H01L 51/5284 313/506 |
| 7,897,979 B2* | 3/2011 | Yamazaki | ........... | H01L 51/5271 257/83 |
| 7,928,427 B1* | 4/2011 | Chang | ................... | H01L 29/165 257/24 |
| 7,948,171 B2* | 5/2011 | Sakakura | ............ | H01L 51/5209 313/506 |
| 8,148,218 B2* | 4/2012 | Chang | ................... | H01L 29/165 438/168 |
| 8,149,346 B2* | 4/2012 | Kimura | ............... | H01L 27/1288 349/43 |
| 2003/0197466 A1* | 10/2003 | Yamazaki | ........... | H01L 51/5271 313/504 |
| 2003/0201716 A1* | 10/2003 | Yamazaki | ............. | H01L 27/322 313/506 |
| 2003/0227021 A1* | 12/2003 | Yamazaki | ........... | H01L 51/5271 257/83 |
| 2005/0073243 A1* | 4/2005 | Yamazaki | ........... | H01L 51/0005 313/498 |
| 2006/0001091 A1 | 1/2006 | Kim | | |
| 2008/0121886 A1* | 5/2008 | Shin | .................... | H01L 27/3276 257/59 |
| 2010/0197141 A1* | 8/2010 | Tu | ........................ | H01L 27/1104 438/702 |
| 2011/0183480 A1* | 7/2011 | Chang | ................... | H01L 29/267 438/168 |
| 2016/0013436 A1* | 1/2016 | Im | ........................ | H01L 27/3276 257/40 |
| 2018/0166521 A1* | 6/2018 | Bae | ..................... | H01L 27/3248 |

FOREIGN PATENT DOCUMENTS

| KR | 10-2017-0086748 A | 7/2017 |
|---|---|---|
| KR | 10-2018-0069175 A | 6/2018 |

* cited by examiner

DISPLAY DEVICE AND MANUFACTURING METHOD THEREOF

CROSS-REFERENCE TO RELATED APPLICATION

Korean Patent Application No. 10-2018-0027352, filed on Mar. 8, 2018, in the Korean Intellectual Property Office, and entitled: "Display Device and Manufacturing Method Thereof," is incorporated by reference herein in its entirety.

BACKGROUND

1. Field

Embodiments relates to a display device and a method for manufacturing the same.

2. Description of the Related Art

A light emitting element is an element that emits light when an exciton formed by coupling holes injected from an anode and electrons injected from a cathode electrode with each other in the organic emission layer is stabilized.

The light emitting element has various merits such as a wide viewing angle, a high response speed, a slim thickness, and low power consumption, and thus is widely applied to various electric and electronic devices such as a television, a monitor, a mobile phone, and the like.

The above information disclosed in this Background section is only for enhancement of understanding of the background of the invention and therefore it may contain information that does not form the prior art that is already known in this country to a person of ordinary skill in the art.

SUMMARY

The embodiments may be realized by providing a display device including a semiconductor layer on a substrate; a gate insulation layer and an interlayer insulation layer that overlap the semiconductor layer; contact holes that penetrate the gate insulation layer and the interlayer insulation layer; a source electrode and a drain electrode that are electrically connected with the semiconductor layer through the contact holes; a light emitting diode that is connected with the drain electrode; and first spacers and second spacers between the source electrode and the interlayer insulation layer and between the drain electrode and the interlayer insulation layer in the contact holes.

The first spacers and the second spacers may be sequentially disposed with reference to the interlayer insulation layer in the contact holes such that the first spacers are between the second spacers and the interlayer insulation layer.

The first spacers may each include a vertical portion extending along an inside circumferential surface of each of the contact holes; and a lower end that is connected with the vertical portion and contacts the semiconductor layer.

The source electrode or the drain electrode may penetrate the lower end.

At least one of the source electrode and the drain electrode may contact an inside surface of the second spacers and an inside surface of the lower end of the first spacers.

Upper surfaces of the lower ends of the first spacers may contact the source electrode or the drain electrode.

The semiconductor layer may be electrically connected with the source electrode and the drain electrode through the first spacers.

The first spacers may include titanium (Ti), molybdenum (Mo), ITO, IZO, or GZO.

The source electrode and the drain electrode may include a same material as the first spacers.

An end of one first spacer and an end of the source electrode may be aligned, or an end of another first spacer and an end of the drain electrode may be aligned.

An upper surface of each first spacer, an upper surface of each second spacer, and an upper surface of the interlayer insulation layer may substantially form the same plane.

One side of the semiconductor layer that overlaps at least one of the source electrode and the drain electrode may not be flat.

One side of the semiconductor layer that overlaps at least one of the source electrode and the drain electrode may have a stepped shape.

A thickness of the first spacers may be thinner than a thickness of the second spacers.

An etching ratio between a material that forms the first spacers and a material that forms the second spacers may be 1:1 to 1:3.

The interlayer insulation layer may include zirconium oxide.

The embodiments may be realized by providing a method for manufacturing a display device, the method including forming a semiconductor layer on a substrate; forming a gate insulation layer and an interlayer insulation layer that overlap the semiconductor layer; forming a contact hole that penetrates the gate insulation layer and the interlayer insulation layer; forming a first spacer material layer and a second spacer material layer on the substrate; exposing the interlayer insulation layer by etching the first spacer material layer and the second spacer material layer; forming a source electrode and a drain electrode on the interlayer insulation layer; and forming a light emitting element that is connected with the drain electrode.

The method may further include forming first spacers by anisotropically etching the first spacer material layer; and forming second spacers by anisotropically etching the second spacer material layer.

The semiconductor layer may be partially exposed while the first spacer material layer and the second spacer material layer are etched.

An etching ratio between a material that forms the first spacer material layer and a material that forms the second spacer material layer may be 1:1 to 1:3.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
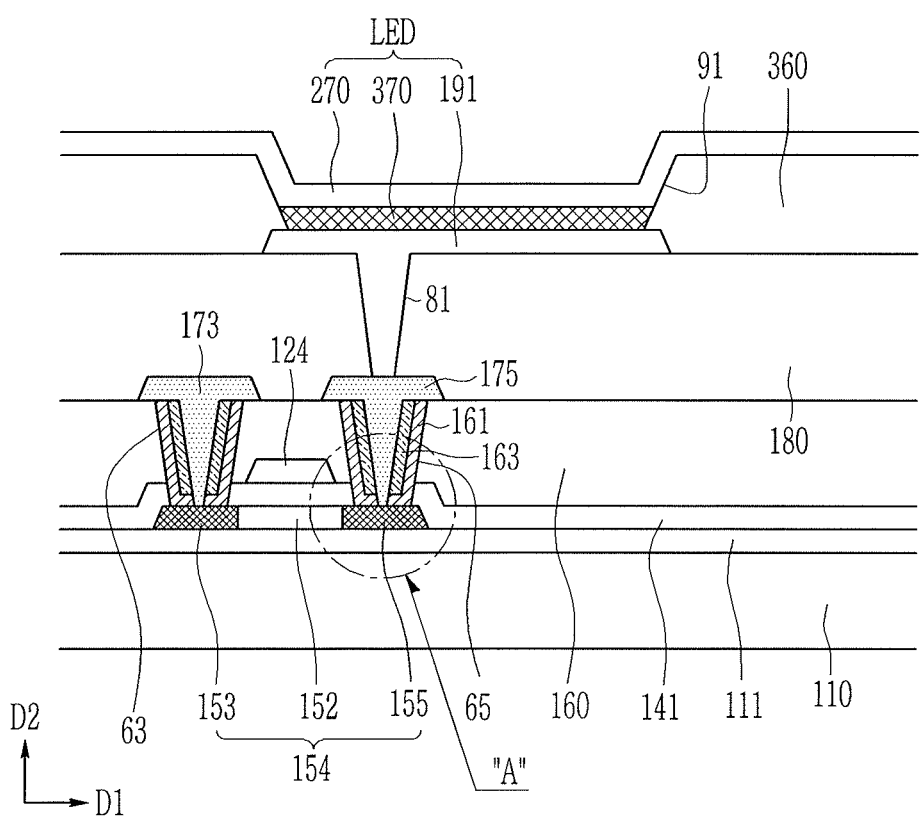
FIG. 1 illustrates a cross-sectional view of a display device according to an exemplary embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" means positioning on or below the object portion, but does not essentially mean positioning on the upper side of the object portion based on a gravitational direction.

In addition, unless explicitly described to the contrary, the word "comprise" and variations such as "includes," "including," "comprises" or "comprising" will be understood to imply the inclusion of stated elements but not the exclusion of any other elements. The term "or" is not an exclusive term.

In this specification, the phrase "on a plane" means viewing a target portion from the top, and the phrase "on a cross-section" means viewing a cross-section formed by vertically cutting a target portion from the side.

Figure 2:
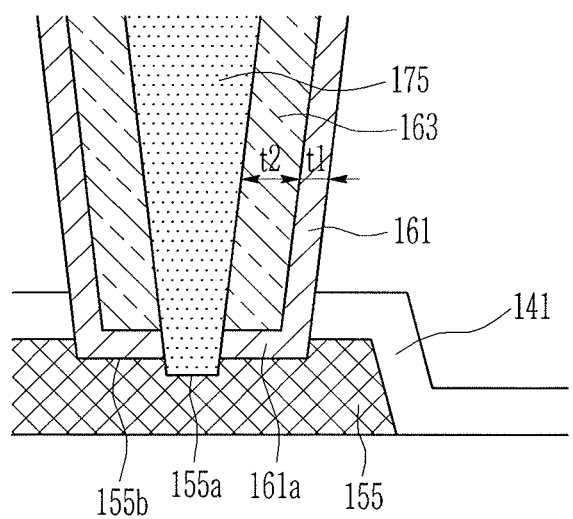
FIG. 2 illustrates an enlarged view of the portion A in FIG. 1.

Hereinafter, a display device according to an exemplary embodiment will be described with reference to FIG. 1 and FIG. 2. FIG. 1 illustrates a cross-sectional view of a display device according to an exemplary embodiment, and FIG. 2 illustrates an enlarged view of the portion A in FIG. 1.

A display device according to an exemplary embodiment may include a substrate 110. The substrate 110 may have flexibility.

A buffer layer 111 may be disposed on the substrate 110. In an implementation, the buffer layer 111 may be omitted. The buffer layer 111 may include an inorganic material such as a silicon oxide, a silicon nitride, or the like. The buffer layer 111 may be provided as a single layer or a multilayer.

The buffer layer 111 may planarize one surface of the substrate 110 or may help prevent dispersion of an impurity that causes deterioration of a characteristic of a semiconductor layer 154, which will be described later, and may help prevent permeation of moisture and the like.

The semiconductor layer 154 of the transistor Tr may be disposed on the buffer layer 111. The semiconductor layer 154 may include a channel region 152, and a source region 153 and a drain region 155 that are disposed at opposite sides of the channel region 152 and doped with an impurity.

The semiconductor layer 154 may include a polysilicon or an oxide semiconductor. The oxide semiconductor may include, e.g., an oxide that is based on titanium (Ti), hafnium (Hf), zirconium (Zr), aluminum (Al), tantalum (Ta), germanium (Ge), zinc (Zn), gallium (Ga), tin (Sn), or indium (In), or a complex oxide thereof.

In an implementation, a light blocking electrode may be disposed between the substrate 110 and the semiconductor layer 154. The light blocking electrode may help prevent characteristic deterioration of the semiconductor layer 154 and minimize a leakage current of the transistor Tr by preventing external light from reaching the semiconductor layer 154.

A gate insulation layer 141 may be disposed on the semiconductor layer 154 and the buffer layer 111. The gate insulating layer 141 may wholly or entirely overlap the substrate 110.

The gate insulating layer 141 may include tetraethoxysilane (TEOS) and a silicon oxide or a silicon nitride. The gate insulating layer 141 may be provided as a single layer or a multilayer.

A gate conductor that includes a gate electrode 124 of the transistor Tr may be disposed on the gate insulation layer 141. The gate electrode 124 may overlap with the channel region 152 of the semiconductor layer 154.

The gate conductor may include a metal such as molybdenum (Mo), copper (Cu), aluminum (Al), silver (Ag), chromium (Cr), tantalum (Ta), titanium (Ti), or the like, or a metal alloy. The gate conductor may be provided as a single layer or a multilayer.

An interlayer insulation layer 160 may be disposed on the gate electrode 124. The interlayer insulation layer 160 may include tetraethoxysilane (TEOS), a silicon oxide, or a silicon nitride. The interlayer insulation layer 160 may be provided as a single layer or a multilayer formed by stacking the single layers.

A data conductor that includes a source electrode 173 and a drain electrode 175 of the transistor Tr, data lines, a driving voltage line, or the like may be disposed on the interlayer insulation layer 160.

The source electrode 173 and the drain electrode 175 may be respectively connected to the source region 153 and the drain region 155 of the semiconductor layer 154 through contact holes 63 and 65 in the interlayer insulation layer 160 and the gate insulating layer 141.

A first spacer 161 and a second spacer 163 may be provided in each of the contact holes 63 and 65. In the contact holes 63 and 65, the first spacer 161 and the second spacer 163 may be disposed between the source electrode 173 and the interlayer insulation layer 160 and between the drain electrode 175 and the interlayer insulation layer 160. The first spacer 161 and the second spacer 163 may be sequentially stacked with reference to an interior surface of the interlayer insulation layer 160 (e.g., the first spacer 161 may be between the second spacer 163 and the interlayer insulation layer 160).

The first spacer 161 may directly contact the interlayer insulation layer 160 and the interior surface of the gate insulation layer 141. The first spacer 161 may have a shape that surrounds or conforms to the interlayer insulation layer 160 and the interior surface of the gate insulation layer 141 where the contact holes 63 and 65 are formed. For example, the first spacer 161 may surround or be conformally on an internal circumferential surface of the contact holes 63 and 65.

The first spacer 161 may include a vertical portion that is formed in the shape of a piece of macaroni (e.g., in a hollow cylindrical or conical shape) that extends in a second direction D2, and a lower end portion 161a that extends in a first direction D1 from a lower end of the vertical portion. The lower end portion 161a of the first spacer 161 may directly contact one side of the semiconductor layer 154. The lower end portion 161a of the first spacer 161 may directly contact one side of the source region 153 or one side of the drain region 155.

The second spacer 163 may have a shape that surrounds an external circumferential surface of the source electrode 173 or the drain electrode 175. The second spacer 163 may directly contact the source electrode 173 or the drain electrode 175 while directly contacting the first spacer 161. The second spacer 163 may have a shape of a piece of macaroni or a pipe (e.g., a hollow cylindrical or conical shape) that extends in the second direction D2. The source electrode 173 and the drain electrode 175 may directly contact the semiconductor layer 154 by penetrating the second spacer 163 and the first spacer 161. For example, each of the source electrode 173 and the drain electrode 175 may be connected to the source region 153 and the drain region 155 of the semiconductor layer 154 by penetrating the lower end portion 161a of the first spacer 161.

The second spacer 163 may overlap the source region 153 or the drain region 155. The lower end portion 161a of the first spacer 161 may be disposed between a bottom surface of the second spacer 163 and the source region 153 or between the bottom surface of the second spacer 163 and the drain region 155. The second spacer 163 may not directly contact the semiconductor layer 154.

One side of the lower end portion 161a of the first spacer 161 and one side of the second spacer 163 may substantially form the same plane (e.g., an inner side or surface of the lower end portion 161a of the first spacer 161 and an inner side or surface of the second spacer 163 may be aligned or concentric). The one side of the lower end portion 161a of the first spacer 161 and the one side of the second spacer 163 that form the same plane may contact the source electrode 173 or the drain electrode 175.

In an implementation, an upper surface of the first spacer 161, an upper surface of the second spacer 163, and an upper surface of the interlayer insulation layer 160 may substantially form the same plane (e.g. may be coplanar). A part of the source electrode 173 and the drain electrode 175 may be disposed on the upper surface of the first spacer 161, the upper surface of the second spacer 163, and the upper surface of the interlayer insulation layer 160 that form the same plane.

The first spacer 161 and the second spacer 163 may have a shape of which a width is gradually reduced toward the substrate 110. For example, the width of the source electrode 173 and the width of the drain electrode 175, which are disposed in the interior side of the second spacer 163, may be gradually reduced toward the substrate 110.

In an implementation, the first spacer 161 may include an oxide, e.g., may include a silicon oxide. The second spacer 163 may include a nitride, e.g., may include a silicon nitride. In an implementation, the second spacer 163 may include the same material as the interlayer insulation layer 160, e.g., may include the same material as a layer that is disposed topmost in the interlayer insulation layer 160 that is formed of a plurality of layers.

A thickness t1 of the first spacer 161 may be smaller than a thickness t2 of the second spacer 163. The second spacer 163 may be thicker than the first spacer 161. For example, a thickness ratio of the first spacer 161 and the second spacer 163 may be 1:1 to 1:20. Such a thickness ratio may be determined by an etching ratio between materials that respectively form the first spacer 161 and the second spacer 163. For example, a material that forms the first spacer 161 and a material that forms the second spacer 163 may have an etching ratio of 1:1 to 1:3.

In an implementation, the source region 153 that contacts the first spacer 161 and the source electrode 173, or the drain region 155 that contacts the first spacer 161 and the drain electrode 175, may have step-shaped first sides 155a and 155b.

The semiconductor layer 154 may be partially etched during a process for forming the interlayer insulation layer 160 and the gate insulating layer 141, and may be partially etched during a process for forming the first spacer 161 and the second spacer 163. In an implementation, the semiconductor layer 154, which has been etched two times as described above, e.g., one side of the drain region 155 or one side of the source region 153, may have the step-shaped first sides 155a and 155b as shown in FIG. 2. In an implementation, when the semiconductor layer 154 has a very thin thickness or a degree of etching of the semiconductor layer 154 during a process is considerably small, a surface that is neither flat not stepped as shown in FIG. 2 may be provided.

The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy. The data conductor may be provided as a single layer or a multilayer (e.g., Ti/Al/Ti, Mo/Al/Mo, Mo/Cu/Mo).

The gate electrode 124, the source electrode 173, and the drain electrode 175 form the transistor Tr together with the semiconductor layer 154. The transistor shown in the drawing may be a driving transistor in a pixel of the light emitting display device. In an implementation, the gate electrode 124 may be higher than the semiconductor layer 154 in the transistor, and the transistor Tr may be called a top-gate type of transistor. In an implementation, the transistor may be a bottom-gate transistor in which a gate electrode is disposed below a semiconductor layer.

In an implementation, a driving thin film transistor of the pixel may be provided. In an implementation, signal lines and organic light emitting elements included in pixels may be formed with various suitable structures. In an implementation, a suitable number of thin film transistors, of capacitors, or wires may be included.

A planarization layer 180 may be disposed on the interlayer insulation layer 160 and the data conductor. The planarization layer 180 may remove a height difference and planarize a surface to improve light emission efficiency of a light emitting element that will be formed thereon. The planarization layer 180 may cover the transistor Tr.

The planarization layer 180 may include, e.g., an organic insulation material. In an implementation, the organic insulation material may include, e.g., polyimide, polyamide, polyacrylate, polyphenylene ether, polyphenylene sulfide, unsaturated polyester, epoxy resin, phenol resin, or the like.

A pixel electrode 191 may be disposed on the planarization layer 180. The pixel electrode 191 may be connected to the drain electrode 175 of the transistor Tr through a contact hole 81 formed in the planarization layer 180.

The pixel electrode 191 may include a reflective conducting material or a semi-transmissive conducting material. In an implementation, the pixel electrode 191 may include, e.g., at least one of transparent conductive materials such as indium tin oxide (ITO), indium zinc oxide (IZO), and the like, and metals such as lithium (Li), calcium (Ca), aluminum (Al), silver (Ag), magnesium (Mg), and gold (Au).

A pixel defining layer 360 may be disposed on the planarization layer 180 and the pixel electrode 191. The pixel defining layer 360 may have an opening 91 that partially overlaps the pixel electrode 191. The opening 91 of the pixel defining layer 360 may limit or define an area that corresponds to a pixel.

In an implementation, the pixel defining layer 360 may include, e.g., an organic insulation material such as polyimide, polyacrylate, polyamide, and the like, or a silica-based inorganic material.

An emission layer 370 may be disposed on the pixel electrode 191. The emission layer 370 includes an emission area, and may additionally include at least one of a hole injection area, a hole transport area, an electron injection area, and an electron transport area.

The emission layer 370 may be made of an organic material that uniquely emits light of a primary color, such as red, green, and blue, or may have a structure in which a plurality of organic materials, each emitting light of a different color, are stacked.

A common electrode 270 that transmits a common voltage may be disposed on the emission layer 370. The common electrode 270 may include, e.g., a transparent conductive material such as indium tin oxide (ITO), indium zinc oxide (IZO), or the like. In an implementation, the common electrode 270 may have light transmittance by thinly laminating a metal such as calcium (Ca), barium (Ba), magnesium (Mg), aluminum (Al), silver (Ag), and the like.

A pixel electrode 191, an emission layer 370, and a common electrode 270 of each pixel form a light emission element, which is a light emitting diode (LED). The pixel electrode 191 may be an anode, which is a hole injection electrode, and the common electrode 270 may be a cathode, which is an electron injection electrode. In an implementation, the pixel electrode 191 may be a cathode and the common electrode 270 may be an anode. Holes and electrons are respectively injected into the emission layer 370 from the pixel electrode 191 and the common electrode 270, and light may be emitted when excitons being combinations of the injected holes and electrons shift from an excited state to a ground state.

The display device may be one of a front emission type, a bottom emission type, and a dual display type depending on a light emission direction of the light emitting diode (LED).

In an implementation, a thin film encapsulation layer may be disposed on the common electrode 270. The thin film encapsulation layer may include a plurality of inorganic layers, or may have a structure in which inorganic layers and organic layers are alternately stacked. Moisture permeation into the light emitting diode can thereby be prevented.

According to the above-stated exemplary embodiment, the contact hole where the source electrode or the drain electrode is disposed may have a considerably small size due to the first spacer and the second spacer. The contact hole may have a diameter of about 1.5 μm or less in order to provide a high-resolution display device. However, there may be a limit in manufacturing a small-sized contact hole by using an exposure process. For example, a contact hole may be formed through an exposure process, and the first spacer and the second spacer, each having a predetermined thickness, may be disposed in the contact hole to thereby reduce the size of the contact hole almost by two times as a deposition thickness of each of the first and second spacers. Accordingly, a high-resolution display device may be provided.

In addition, the first spacer may serve as an etch stopper that prevents the interlayer insulation layer from being excessively etched or a thin semiconductor layer from being lost while the first spacer and the second spacer are etched. Thus, a display device having improved reliability may be provided.

Figure 3:
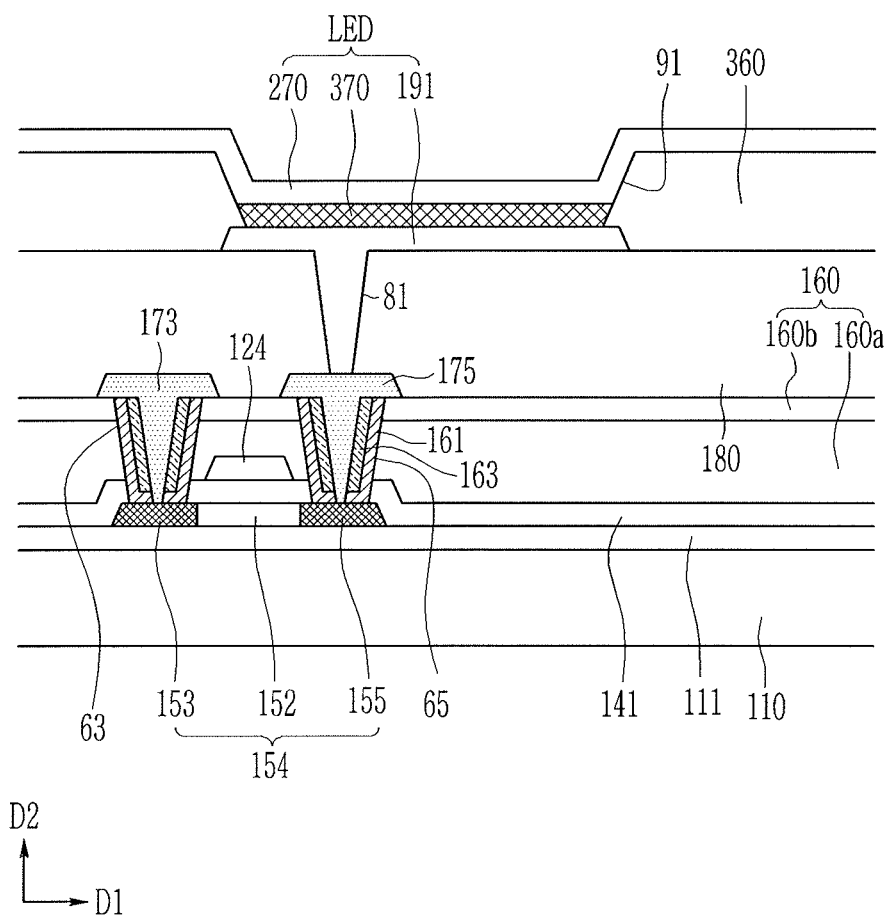
FIG. 3 and FIG. 4 illustrate cross-sectional views of a display device according to an exemplary variation of the exemplary embodiment of FIG. 1.
Figure 4:
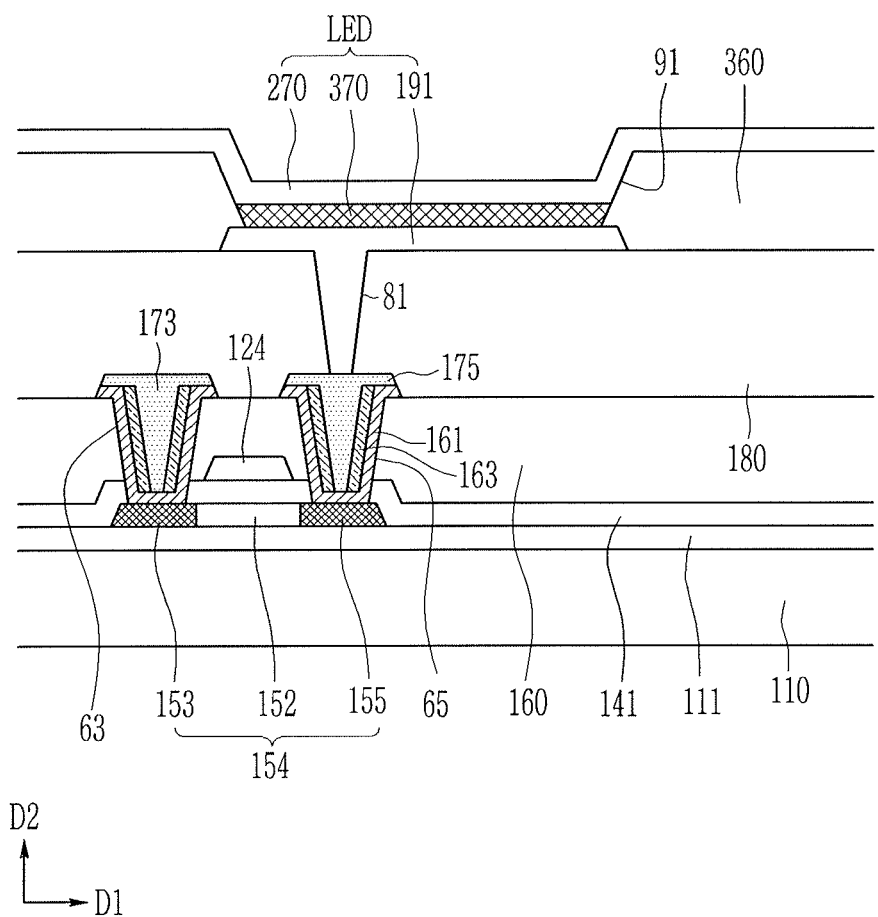

Hereinafter, a display device according to an exemplary variation will be described with reference to FIG. 3 and FIG. 4. FIG. 3 and FIG. 4 illustrate cross-sectional views of display devices respectively according to exemplary variations of the display device of FIG. 1. Hereinafter, description of components similar to those described in the above-described embodiments may be omitted.

First, referring to FIG. 3, an interlayer insulation layer 160 according to the present exemplary variation may include a first interlayer insulation layer 160a and a second interlayer insulation layer 160b. In an implementation, as illustrated in FIG. 3, the interlayer insulation layer 160 may be provided as a double-stacked layer. In an implementation, the interlayer insulation layer 160 may be provided as a multi-interlayer insulation layer including more than two layers.

The first interlayer insulation layer 160a may be disposed on a gate electrode 124 and a gate insulating layer 141. In an implementation, the first interlayer insulation layer 160a may be provided as a single layer including tetraethoxysilane (TEOS), a silicon oxide, or a silicon nitride, or a multilayer of the single layers.

The second interlayer insulation layer 160b may be disposed between the first interlayer insulation layer 160a and a planarization layer 180. In an implementation, the second interlayer insulation layer 160b may include a high-k material, e.g., zirconium oxide ($ZrO_x$) or hafnium oxide ($HfO_x$).

The second interlayer insulation layer 160b may help prevent the interlayer insulation layer 160 from being excessively etched while a first spacer 161 and a second spacer 163 are formed. The second interlayer insulation layer 160b may serve as an etch stopper.

An upper surface of the first spacer 161, an upper surface of the second spacer 163, and an upper surface of the second interlayer insulation layer 160b may substantially form the same plane. A source electrode 173 and a drain electrode 175 may be disposed on the upper surface of the first spacer 161, the upper surface of the second spacer 163, and the upper surface of the second interlayer insulation layer 160b that form the same plane.

Next, referring to FIG. 4, a first spacer 161 and a second spacer 163 may be respectively provided in contact holes 63 and 65 according to the present exemplary variation. The first spacer 161 and the second spacer 163 may be respectively provided between a source electrode 173 and an interlayer insulation layer 160 and between a drain electrode 175 and the interlayer insulation layer 160 in the contact holes 63 and 65. The first spacer 161 and the second spacer 163 may be sequentially stacked with reference to an interior surface of the interlayer insulation layer 160.

The first spacer 161 may have a shape of a cup. The first spacer 161 may include a pipe-shaped vertical portion that surrounds or is conformally on an inside circumferential surface of each of the contact holes 63 and 65, and a lower end 161a that contacts one side of the semiconductor layer 154. In the present exemplary variation, the lower end 161a of the spacer 161 may have a closed shape.

An upper surface of the lower end 161a of the first spacer 161 and the source electrode 173, and the upper surface of the lower end 161a of the first spacer 161 and the drain electrode 175, may contact each other. For example, the source electrode 173 and the drain electrode 175 may be electrically connected with the semiconductor layer 154 through the first spacer 161 rather than directly contacting the semiconductor layer 154.

The first spacer 161 may include a material that may be electrically connected with the semiconductor layer 154. In an implementation, the first spacer 161 may include a material that can carry out ohmic contact, e.g., titanium (Ti), molybdenum (Mo), ITO, IZO, or GZO.

In an implementation, the first spacer 161 may include one of materials included in the source electrode 173 and the drain electrode 175. In this case, the first spacer 161 may be formed during a process for forming the source electrode 173 and the drain electrode 175.

In an implementation, an end of the first spacer 161 and an end of the source electrode 173 may be aligned. In an implementation, the end of the first spacer 171 and an end of the drain electrode 175 may be aligned. When the first spacer 161 and a data conductor are formed through the same process, the first spacer 161 and the data conductor may include the same edges.

Hereinafter, a method for manufacturing a display device according to an exemplary embodiment will be described with reference to FIG. 5 to FIG. 8. FIG. 5, FIG. 6, FIG. 7, and FIG. 8 are cross-sectional views of the manufacturing method of the display device. A detailed description of the same components as those of the above-described components may be omitted.

Figure 5:
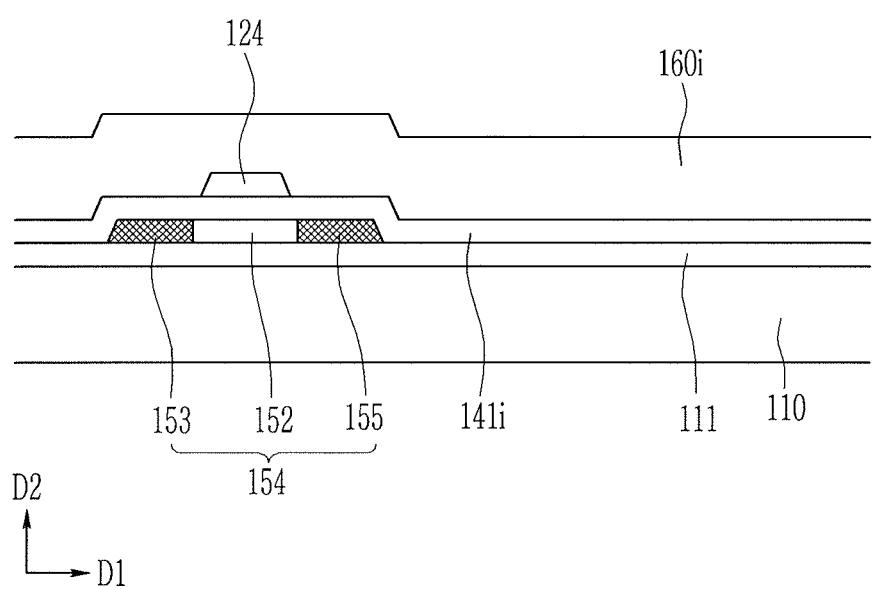
FIG. 5, FIG. 6, FIG. 7, and FIG. 8 illustrate cross-sectional views of stages in a method for manufacturing a display device.

First, as shown in FIG. 5, a buffer layer 111 may be formed on a substrate 110. A semiconductor layer 154 that includes a channel region 152, and a source region 153 and a drain region 155 that are disposed at opposite sides of the channel region 152, may be formed on the buffer layer 111. A gate insulation material layer 141*i* that overlaps the entire surface of the substrate 110 may be formed on the semiconductor layer 154 and the buffer layer 111. A gate electrode 124 that overlaps the channel region 152 may be formed on the gate insulation material layer 141*i*. An interlayer insulation material layer 160*i* that overlaps the entire surface of the substrate 110 may be formed on the gate electrode 124 and the gate insulation material layer 141*i*.

Figure 6:
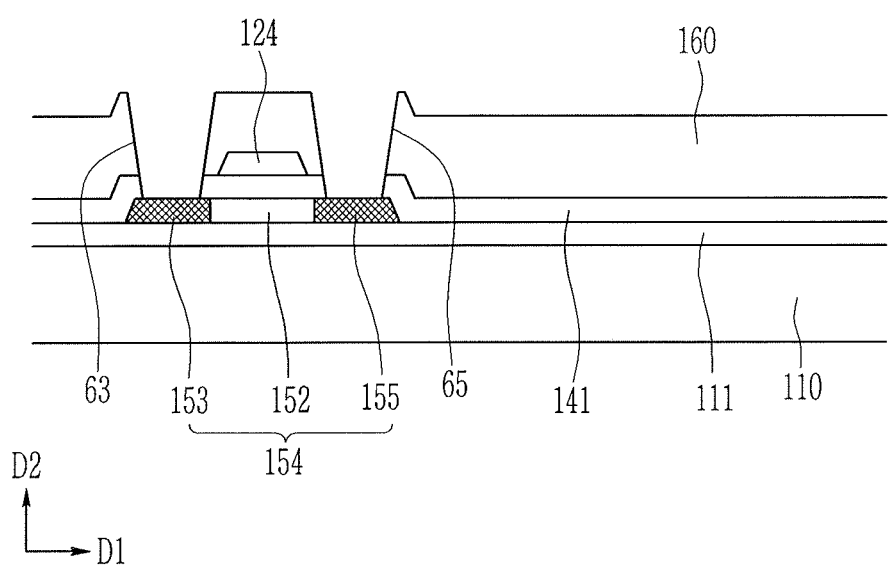

Next, as shown in FIG. 6, an interlayer insulation layer 160 and a gate insulation layer 141 (that include a contact hole 63 and a contact hole 65) may be formed. The contact hole 63 may expose the source region 153 and the contact hole 65 may expose the drain region 155. The interlayer insulation layer 160 and the gate insulation layer 141*i* may be formed by etching the gate insulation material layer 141*i* and the interlayer insulation material layer 160*i*.

Figure 7:
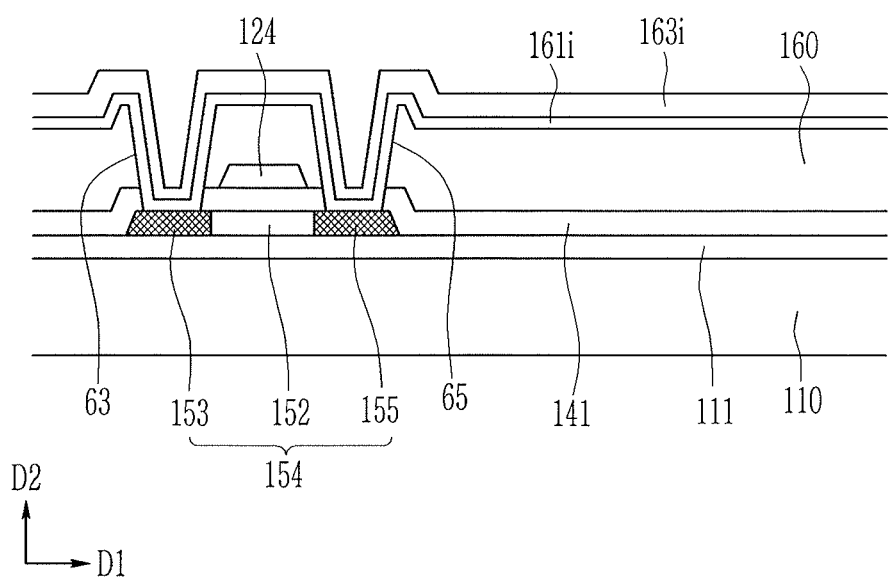

Next, as shown in FIG. 7, a first spacer material layer 161*i* and a second spacer material layer 163*i* may be formed all over (e.g., completely covering) the substrate 110.

Figure 8:
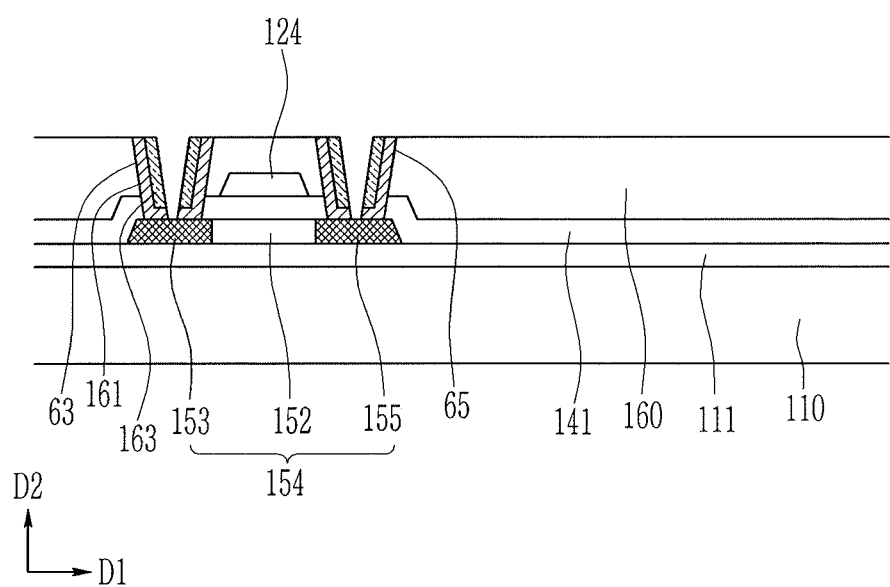

Next, as shown in FIG. 8, a first spacer 161 and a second spacer 163 may be formed by etching the first spacer material layer 161*i* and the second spacer material layer 163*i*.

The first spacer 161 and the second spacer 163 may be formed by anisotropically etching the first spacer material layer 161*i* and the second spacer material layer 163*i*. The first spacer material layer 161*i* and the second spacer material layer 163*i* on the interlayer insulation layer 160 may be etched until the interlayer insulation layer 160 is exposed. Simultaneously, the first spacer material layer 161*i* and the second spacer material layer 163*i* may be etched until the source region 153 and the drain region 155 of the semiconductor layer 154 are exposed.

During such an etching process, etching rates of the second spacer material 163*i* and the first spacer material layer 161*i* may be different from each other. For example, an etching ratio between the second spacer material layer 163*i* and the first spacer material layer 161*i* may be 1:1 to 3:1. A degree of etching of the second spacer material layer 163*i* may be greater than a degree of etching of the first spacer material layer 161*i*.

Depending on the etching ratio, a thickness of the second spacer material layer 163*i* and a thickness of the first spacer material layer 161*i* may be determined. The second spacer material layer 163*i* may be thicker than the first spacer material layer 161*i*, e.g., a thickness ratio of the second spacer material layer 163*i* and the first spacer material layer 161*i* may be 1:1 to 20:1.

In an implementation, the second spacer material layer 163*i* and the first spacer material layer 161*i* may include different materials, and the first spacer material layer 161*i* and the interlayer insulation layer 160 may include different materials.

The first spacer material layer 161*i* and the second spacer material layer 163*i* may include different materials, the first spacer material layer 161*i* and the second spacer material layer 163*i* may have different etching rates, and thus the first spacer material layer 161*i* may serve as an etch stopper during a process for etching the second spacer material layer 163*i*. In an implementation, the interlayer insulation layer 160 may serve as an etch stopper during a process for etching the second spacer material layer 163*i*.

Each layer may serve as an etch stopper during an etching process, and the interlayer insulation layer 160 or the semiconductor layer 154 can be prevented from being damaged.

In an implementation, when the interlayer insulation layer includes zirconium oxide, as shown in FIG. 3, an etching selection ratio between the first spacer material layer 161*i* and the interlayer insulation layer 160 may be increased during a process for etching the first spacer material layer 161*i*. Accordingly, the spacers may be formed while minimizing damage to the interlayer insulation layer 160.

In an implementation, when the first spacer 161 includes a material that can carry out ohmic contact, as shown in FIG. 4, the first spacer material layer 161*i* may be etched during a process for forming the source electrode 173 and the drain electrode 175 and thus the first spacer 161 may be formed.

By way of summation and review, the size of a pixel may become smaller as the structure has increased resolution. For example, there may be a limit in a design rule due to a limit in equipment specifications and photolithography process capability.

When the display device is manufactured through the above-stated exemplary embodiments, contact holes where the source electrode and the drain electrode are respectively disposed may be reduced to a considerably small size by the first spacer and the second spacer. According to the exemplary embodiment, the contact holes may be provided by using the exposure process, and the first spacer and the second spacer, each having a predetermined thickness, may be disposed in the contact holes such that the size of each of the contact holes may be reduced by almost two times (e.g., half the original size) as a deposition thickness of the first spacer and the second spacer. Accordingly, a high resolution display device can be provided.

The embodiments may provide a display device that includes small-sized contact holes.

According to the exemplary embodiments, a display device having small-sized contact holes may be provided. Accordingly, a high resolution display device may be provided. In addition, damage to the semiconductor layer and the interlayer insulation layer may be prevented, thereby improving reliability of the display device.

In addition, the first spacer may serve as an etch stopper that can prevent the interlayer insulation layer from being excessively etched or a thin semiconductor layer from being lost during an etching process of the second spacer and the

DESCRIPTION OF SYMBOLS

110: substrate
141: gate insulating layer
154: semiconductor layer
160: interlayer insulation layer
161: first spacer
163: second spacer
173: source electrode
175: drain electrode
63, 65: contact hole
LED: light emitting element Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising: p1 a semiconductor layer on a substrate;
a gate insulation layer and an interlayer insulation layer that overlap the semiconductor layer;
contact holes that penetrate the gate insulation layer and the interlayer insulation layer;
a source electrode and a drain electrode that are electrically connected with the semiconductor layer through the contact holes;
a light emitting diode that is connected with the drain electrode; and
first spacers between the source electrode and the interlayer insulation layer and between the drain electrode and the interlayer insulation layer in the contact holes, and
second spacers between the source electrode and the first spacers and between the drain electrode and the first spacers in the contact holes, wherein
the source electrode and the drain electrode are provided as a triple layer.

2. The display device as claimed in claim 1, wherein the first spacers and the second spacers are sequentially disposed with reference to the interlayer insulation layer in the contact holes such that the first spacers are between the second spacers and the interlayer insulation layer.

3. The display device as claimed in claim 1, wherein the first spacers each include:
a vertical portion extending along an inside circumferential surface of each of the contact holes; and
a lower end that is connected with the vertical portion and contacts the semiconductor layer.

4. The display device as claimed in claim 3, wherein the source electrode or the drain electrode penetrates the lower end.

5. The display device as claimed in claim 3, wherein at least one of the source electrode and the drain electrode contacts an inside surface of the second spacers and an inside surface of the lower end of the first spacers.

6. The display device as claimed in claim 3, wherein upper surfaces of the lower ends of the first spacers contact the source electrode or the drain electrode.

7. The display device as claimed in claim 6, wherein the semiconductor layer is electrically connected with the source electrode and the drain electrode through the first spacers.

8. The display device as claimed in claim 7, wherein the first spacers include titanium (Ti), molybdenum (Mo), ITO, IZO, or GZO.

9. The display device as claimed in claim 8, wherein the source electrode and the drain electrode include a same material as the first spacers.

10. The display device as claimed in claim 7, wherein:
an end of one first spacer and an end of the source electrode are aligned, or
an end of another first spacer and an end of the drain electrode are aligned.

11. The display device as claimed in claim 1, wherein one side of the semiconductor layer that overlaps at least one of the source electrode and the drain electrode has a concave top surface.

12. The display device as claimed in claim 11, wherein one side of the semiconductor layer that overlaps at least one of the source electrode and the drain electrode has a stepped shape.

13. The display device as claimed in claim 1, wherein a thickness of the first spacers is thinner than a thickness of the second spacers.

14. The display device as claimed in claim 1, wherein an etching ratio between a material that forms the first spacers and a material that forms the second spacers is 1:1 to 1:3.

15. The display device as claimed in claim 1, wherein the interlayer insulation layer includes zirconium oxide.

16. The display device as claimed in claim 1, wherein an upper surface of each first spacer, an upper surface of each second spacer, and an upper surface of the interlayer insulation layer substantially form the same plane.

17. The display device as claimed in claim 1, wherein at least one of the source electrode and the drain electrode directly contacts the semiconductor layer.

18. The display device as claimed in claim 1,
the triple layer comprises a first layer comprising titanium, a second layer comprising aluminum, a third layer comprising a titanium.

* * * * *